United States Patent
Hsia et al.

[11] Patent Number: 6,087,726
[45] Date of Patent: Jul. 11, 2000

[54] METAL INTERCONNECT STACK FOR INTEGRATED CIRCUIT STRUCTURE

[75] Inventors: Shouli Steve Hsia, San Jose; Zhihai Wang, Sunnyvale, both of Calif.; Fred Chen, Hsin-Chu, Taiwan

[73] Assignee: LSI Logic Corporation, Milpitas, Calif.

[21] Appl. No.: 09/261,270

[22] Filed: Mar. 1, 1999

[51] Int. Cl.[7] ........................... H01L 23/48; H01L 23/52; H01L 29/40
[52] U.S. Cl. ........................... 257/751; 257/763; 257/764
[58] Field of Search ........................ 257/751, 763, 257/764, 767

[56] References Cited

U.S. PATENT DOCUMENTS

| | | |
|---|---|---|
| 5,594,278 | 1/1997 | Uchiyama et al. . |
| 5,625,231 | 4/1997 | Huang et al. . |
| 5,675,186 | 10/1997 | Shen et al. . |
| 5,686,760 | 11/1997 | Miyakawa . |
| 5,780,908 | 7/1998 | Sekiguchi et al. . |
| 5,892,282 | 4/1999 | Hong et al. . |

Primary Examiner—Sheila V. Clark

[57] ABSTRACT

A metal interconnect stack for an integrated circuit structure is described comprising a main metal interconnect layer, an underlying TiN barrier layer and a titanium metal seed layer below the TiN barrier layer, and a barrier layer below the titanium metal seed layer to provide protection against chemical interaction between the titanium metal seed layer and an underlying plug in a via. The structure is formed by providing an integrated circuit structure having an insulation layer formed thereon with one or more metal-filled vias or contact openings generally vertically formed therethrough to have an upper surface thereon; forming a lower barrier layer such as a TiN barrier layer over the insulation layer and the upper surface of the metal in the one or more metal-filled vias; and subsequently forming the titanium seed layer over the lower TiN barrier layer. This new first TiN barrier layer then separates the surface of the metal in the one or more vias from the titanium seed layer in the metal interconnect stack to inhibit galvanic action between the metal in the one or more vias and the titanium seed layer. Preferably, the main metal interconnect layer is provided with a <111> crystallographic orientation to enhance the electron migration of the main metal interconnect layer. To achieve this <111> orientation in the main metal interconnect layer, the main titanium nitride barrier layer is preferably also provided with <111> crystallographic orientation and the titanium metal seed layer functions as a seed layer for the second TiN barrier layer which will, in turn, act as a seed layer for the main metal interconnect layer. An optional third TiN barrier layer may be formed over the main metal interconnect layer.

11 Claims, 2 Drawing Sheets

6,087,726

METAL INTERCONNECT STACK FOR INTEGRATED CIRCUIT STRUCTURE

BACKGROUND OF THE INVENTION

1. Field of the Invention

This invention relates to an improved metal interconnect for an integrated circuit structure. More particularly, this invention relates to a metal interconnect stack for an integrated circuit structure wherein a protective layer is added to the metal stack to inhibit reaction with an underlying tungsten-filled via or contact opening.

2. Description of the Related Art

Integrated circuit structures include metal interconnects to provide electrical connections between active and passive devices which form part of the integrated circuit structure. These generally horizontal metal interconnects, in turn, connect to generally vertical metal-filled vias or contact openings to provide both horizontal and vertical electrical access or connections throughout the integrated circuit structure.

As shown in prior art FIGS. 1 and 2, aluminum and copper, and their alloys, including aluminum/copper alloys, are at present, the materials of choice for the formation of a main metal interconnect layer 6 of a metal interconnect stack 1. However, due to the interaction of aluminum and/or copper with other materials, such as A silicon substrate, a lower barrier layer 4 and an upper barrier layer 8 are usually provided, respectively, below and above main aluminum/copper metal interconnect layer 6. Titanium nitride (TiN) is, at present, a popular material for use in formation of such barrier layers 4 and 8.

It has been found that to maximize electron migration through main aluminum/copper metal interconnect layer 6, main layer 6 should be composed of crystallographic grains with <111> orientation. To achieve such crystallographic orientation, it is very important that underlying TiN barrier layer 4 also has this <111> crystallographic orientation, since TiN barrier layer 4, below main aluminum/copper metal interconnect layer 6, acts as a seed layer during the CVD or PVD formation or deposition of main aluminum/copper metal layer 6. However, to achieve a <111> orientation of underlying TiN barrier layer 4, it has been found necessary to first provide a titanium metal layer 2 beneath TiN barrier layer 4 which when its surface had been cleaned to remove contaminates, in turn, acts as a seed layer for the formation of TiN barrier layer 4 with a <111> orientation.

Thus, conventional prior art metal interconnect stack 1, as shown in FIGS. 1 and 2, comprises a titanium metal seed layer 2 having a cleaned surface thereon, lower TiN barrier layer 4 thereon having a <111> crystallographic orientation, a <111> aluminum/copper main metal interconnect layer 6 over TiN barrier layer 4, and upper TiN barrier layer 8 formed over aluminum/copper main metal layer 6.

The metal-filled vias or contact openings beneath the metal interconnect stack 1 provide vertical electrical connection either as metal-filled vias to an underlying metal interconnect stack or as metal-filled contact openings, for example, to underlying active or passive devices of the integrated circuit structure.

As shown in FIGS. 1 and 2, an insulation layer 14, such as silicon oxide ($SiO_2$) 14 is formed over an existing integrated circuit structure 12 (which may comprise a semiconductor substrate with active devices constructed therein, or may further comprise such structure as well as a lower insulation layer and a first metal interconnect stack already formed beneath insulation layer 14). A via or interconnect opening 16 is formed in insulation layer 14 down to underlying integrated circuit structure 12, and via 16 is filled with a conductive metal plug 20.

Currently tungsten is the metal of choice used to form metal plug 20 to fill such vias or contact openings 16, which in turn, make electrical contact with titanium layer 2 comprising the lowest layer of metal interconnect stack 1.

However, as shown in prior art FIGS. 1 and 2, sometimes metal interconnect stack 1 and tungsten plug 20 in via or contact opening 16 are misaligned with respect to one another, resulting in exposure of a portion 22 of the upper surface of tungsten plug 20 (which surface should be completely covered by metal interconnect stack 1).

Such misalignment results in an exposure of portion 22 of the upper surface of the tungsten plug 20 which can cause a corrosion problem which may, in turn, lead to failure of the integrated circuit structure. This is because the exposed titanium/tungsten interface, upon being contacted by either wet etchants used to pattern the metal interconnect stack or cleaning solutions used to clean the structure to remove etch residues after the etch step, can form a galvanic cell, with titanium layer 2 and tungsten plug 20 forming the electrodes and the etchant/cleaning solution acting as the electrolyte. This, in turn, can result in attack and erosion of tungsten plug 20, as well as oxidation of titanium layer 2.

Since some horizontal misalignment between metal interconnect stack 1 and tungsten plug 20 may occur, however infrequently, it would be of great benefit if the metal interconnect stack could be modified to inhibit such galvanic interaction between the tungsten plug in the via or contact opening and the titanium layer in the metal interconnect stack.

SUMMARY OF THE INVENTION

In accordance with the invention, a metal interconnect stack for an integrated circuit structure, comprising a main metal interconnect layer, an underlying TiN barrier layer and a titanium metal seed layer below the TiN barrier layer, and having protection against chemical interaction between the titanium metal seed layer and an underlying plug in a via, is formed by the steps of: providing an integrated circuit structure having an insulation layer formed thereon with one or more metal-filled vias or contact openings generally vertically formed therethrough to have an upper surface thereon; forming a lower barrier layer over the insulation layer and the upper surface of the metal in the one or more metal-filled vias; and subsequently forming the titanium seed layer over the lower barrier layer. This new lower barrier layer then separates the surface of the metal in the one or more vias from the titanium seed layer in the metal interconnect stack to inhibit galvanic action between the metal in the one or more vias and the titanium seed layer.

The TiN barrier layer directly below the main metal interconnect layer is then formed over the titanium seed layer, as a main TiN barrier layer, and the metal interconnect layer is then formed over this main TiN barrier layer. An optional upper TiN barrier layer may be formed over the main metal interconnect layer. Preferably, the main metal interconnect layer is provided with a <111> crystallographic orientation to enhance the electron migration of the main metal interconnect layer. To achieve this <111> orientation in the main metal interconnect layer, the main TiN barrier layer is preferably also provided with <111> crystallographic orientation to act as a seed layer for the main metal interconnect layer. The titanium metal seed layer then, in turn, functions as a seed layer for the main TiN barrier layer to assist in the formation of the main TiN barrier layer with the desired <111> orientation, so that the main TiN barrier layer will, in turn, act as a seed layer for the main metal interconnect layer.

DETAILED DESCRIPTION OF THE INVENTION

Figure 1:
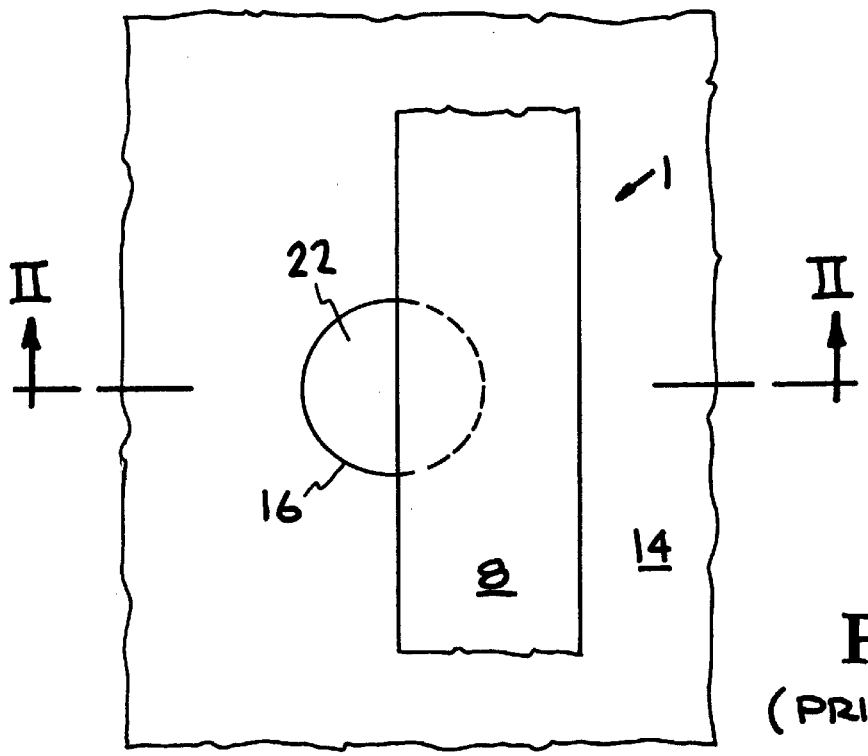
FIG. 1 is a fragmentary top view of a prior art integrated circuit structure showing exposure of a portion of a tungsten plug in a via due to misalignment of the overlying metal interconnect stack.
Figure 2:
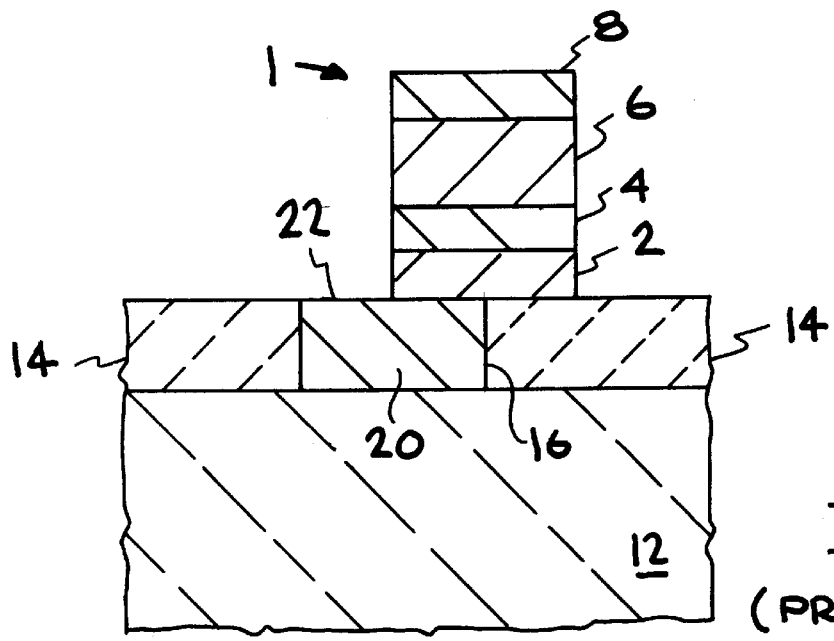
FIG. 2 is a fragmentary vertical side section view of the prior art structure of FIG. 1 taken along lines II—II.
Figure 3:
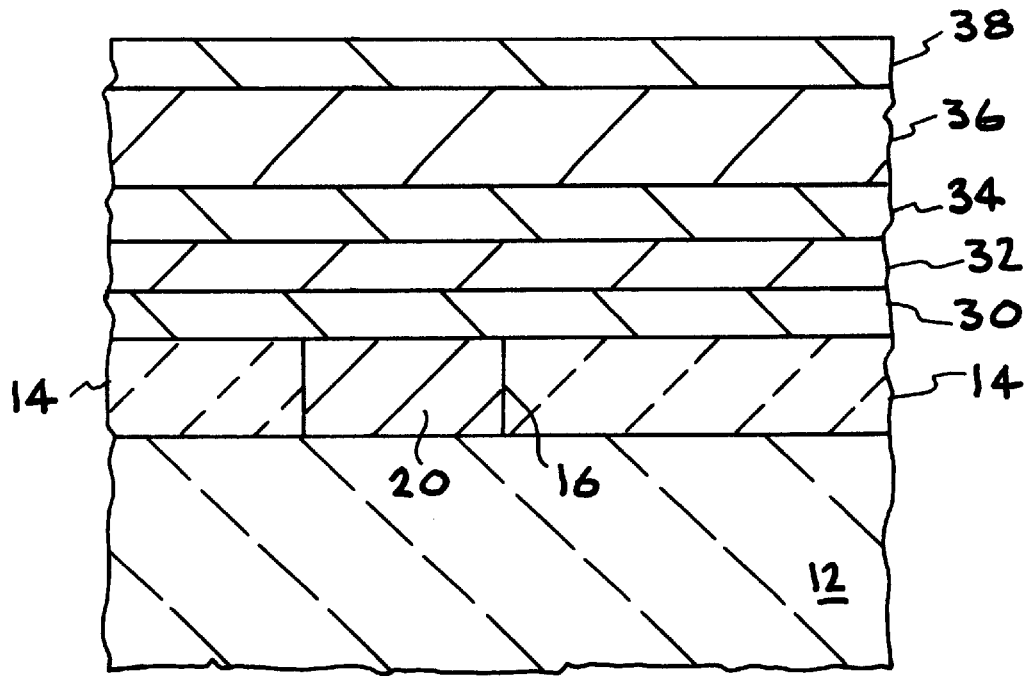
FIG. 3 is a fragmentary vertical side section view of an integrated circuit structure showing a dielectric layer formed over lower portions of the integrated circuit structure with a tungsten-filled via shown vertically formed through the dielectric layer with the first barrier layer of the invention shown formed as a TiN first barrier layer over the dielectric layer and the top surface of the tungsten plug in the via, and the conventional Ti/TiN/Al—Cu/TiN layers formed over the first barrier layer.
Figure 4:
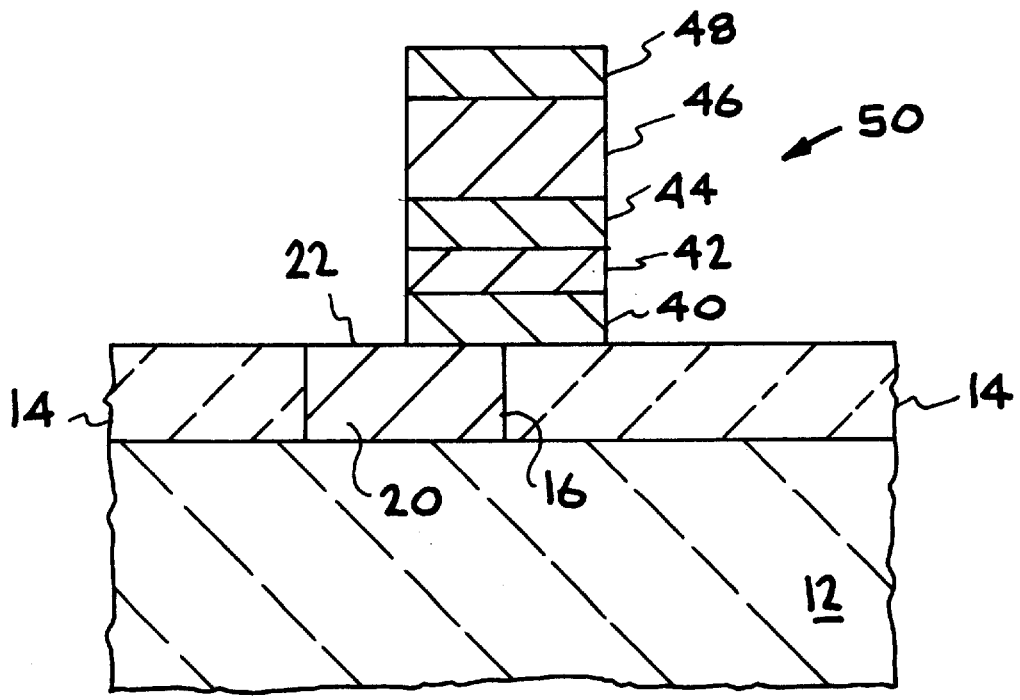
FIG. 4 is a fragmentary vertical side section view of the structure of FIG. 3 with the TiN/Ti/TiN/Al—Cu/TiN layers all patterned to form the metal interconnect stack of the invention.

Turning now to FIGS. 3 and 4, formation of the metal interconnect stack of the invention will be illustrated. As in the FIG. 1 description of the prior art, a dielectric layer 14, such as silicon oxide ($SiO_2$), is formed over an integrated circuit structure 12 which may, in turn, comprise either a semiconductor structure with one or more active devices formed therein, or such a structure as well as a lower insulation layer formed thereon and a lower metal interconnect stack formed over the lower insulation layer.

A via or contact opening 16 is shown vertically etched through insulation layer 14. The terms "via" and "contact opening", as used herein, will be understood to both refer to a generally vertical opening 16 through insulation layer 14 and, therefore, to be interchangeable regardless of whether the opening is a via etched down to an underlying metal interconnect comprising the upper portion of integrated circuit structure 12, or a contact opening etched down to a component in or on a semiconductor substrate comprising integrated circuit structure 12.

Via 16 is shown filled with a tungsten plug 20 therein, which may be formed by blanket deposition of a tungsten layer followed by removal of the tungsten on the upper surface of insulation layer 14 (e.g., by a planarization step using a dry etch or a chemical/mechanical polishing).

In accordance with one embodiment of the invention, a first barrier layer 30 is formed directly over insulation layer 14 and the top surface of tungsten plug 20. First barrier layer 30 is formed to a thickness which may range from at least about 5 nm (50 Angstroms) up to a maximum of about 50 nm (500 Angstroms), and preferably up to a maximum of less than about 30 nm (300 Angstroms). The minimum thickness is selected to be a thickness which will be sufficient to provide a chemical barrier between tungsten plug 20 and a titanium metal seed layer 32 to be formed over first barrier layer 30 to inhibit direct contact and galvanic action between tungsten metal plug 20 and titanium metal seed layer 32. The maximum thickness of first barrier layer 30 is influenced both by the resistivity of first barrier layer 30 (which is higher than that of tungsten metal plug 20 or titanium metal layer 32), and the need to inhibit first barrier layer 30 from acting as a seed layer below titanium metal seed layer 32, which might influence the crystallographic orientation of titanium metal seed layer 32.

First barrier layer 30 preferably comprises a TiN layer. However, it is within the scope of the invention to use other metal compounds for barrier layer 30 to separate tungsten metal plug 20 from titanium metal layer 32, such as, for example, tungsten nitride (WN) or tantalum nitride (TaN). However, since the function of the metal interconnect stack is to form a low resistance wiring or interconnect between tungsten metal plug 20 and other portions of the integrated circuit structure, it is very important that the barrier material selected for use as first barrier layer 30 have a resistivity not exceeding approximately that of TiN. For purposes of illustration, and not of limitation, first barrier layer 30 will hereinafter be described as a first TiN barrier layer.

First TiN barrier layer 30 may be formed over insulation layer 14 and tungsten plug 20 either by the sputtering (physical vapor deposition) of titanium nitride from a titanium nitride target or by a reactive sputtering of titanium from a titanium metal target in the presence of a nitrogen-containing gas or vapor which will react with the sputtered titanium atoms in situ to form TiN which then deposits on insulation layer 14 and tungsten plug 20 to form TiN barrier layer 30.

When the physical vapor deposition (PVD) step comprises direct sputtering of TiN from a TiN target, the resulting TiN-covered integrated circuit structure is then moved to a different sputtering chamber (preferably in the same multi-chambered vacuum apparatus) to then sputter titanium metal layer 32 over TiN barrier layer 30 from a titanium metal target.

In a preferred embodiment, however, first TiN barrier layer 30 and titanium metal layer 32 are both deposited over insulation layer 14 and tungsten metal plug 20 in the same chamber by first depositing the desired TiN barrier layer 30 by sputtering titanium from a titanium metal target in the presence of nitrogen from a nitrogen-containing gas or vapor, and then shutting off the flow of such nitrogen-containing gas or vapor into the sputtering chamber resulting in the sputtering of only titanium metal over TiN first barrier layer 30, thereby forming titanium metal layer 32 over first TiN barrier layer 30 in the same sputtering chamber.

When the same chamber is used to sputter deposit (PVD) both first TiN barrier layer 30 and titanium metal layer 32, as described above, a gradient may be formed between first TiN barrier layer 30 and titanium metal layer 32 by slowly reducing the nitrogen-containing gas or vapor flow after about 5 nm (50 Angstroms) of TiN has formed, with the flow then reduced to zero (shut off) after about 10 nm (100 Angstroms) of TiN has deposited.

The sputtering step to deposit the TiN layer may be carried out using any conventional sputtering apparatus. Typically, when sputtering TiN, the sputtering beam will comprise argon and nitrogen atoms at a power (energy) level of from about 3 kilowatts (kw) to about 9 kw, at a pressure typically ranging from about 0.1 millitorr to about 0.1 torr, a substrate temperature ranging from about 25° C. to about 400° C., with a target bias of from about 100 volts to about 1000 volts, and a substrate support bias of from about 200 volts to about 1200 volts. When titanium metal is to be sputtered, the same parameters will apply, except that only argon atoms are used in the sputtering beam, and the nitrogen-containing gas or vapor will be flowed into the sputtering chamber with a flow rate range equivalent to from about 20 sccm to about 100 sccm into a 5 liter chamber.

After formation of first TiN barrier layer 30 of the invention, conventional titanium metal seed layer 32 is formed, i.e., deposited over TiN barrier layer 30 to a thickness ranging from about 10 nm to about 40 nm. As previously pointed out, the purpose of titanium metal seed layer 32 is to provide a seed layer for conventional main TiN barrier layer 34 subsequently formed thereon, so that main TiN barrier layer 34 will also have the <111> crystallographic orientation desired for subsequently deposited main metal interconnect layer 36. When titanium metal seed layer 32 is deposited by sputtering, i.e., by PVD, and then subsequently cleaned to remove surface contamination, it has been found that Ti metal layer 32 will function as a seed layer 32 for the subsequent deposition of a <111> oriented main TiN barrier layer 34 thereon, which, in turn, will function as a seed layer for main metal interconnect layer 36.

After formation of titanium metal seed layer 32, main TiN barrier layer 34 is formed to a thickness ranging from about 5 nm (50 Angstroms) to about 50 nm (500 Angstroms) by either direct sputtering of TiN from a TiN target or by reactive sputtering of titanium metal from a titanium metal sputtering target in the presence of a nitrogen-containing gas or vapor, as previously described above with respect to the sputter depositing of first TiN barrier layer 30.

As shown in FIG. 3, after deposition of titanium metal seed layer 32 and main TiN barrier layer 34 thereover, main metal interconnect layer 36 is deposited over main TiN barrier layer 34 by any suitable deposition method such as PVD which will result in the formation of the metal layer with the desired <111> orientation to a thickness of from about 30 nm (300 Angstroms) to 1000 nm (10,000 Angstroms). The <111> orientation of underlying main TiN barrier layer 34 will result in main metal interconnect layer 36 also having a <111> orientation to thereby optimize electron migration through main metal interconnect layer 36. Main metal interconnect layer 36 conventionally comprises an aluminum metal, a copper metal, or an aluminum-copper alloy, although the use of other metals, e.g., titanium, tungsten, gold, etc. is also possible.

Finally, top TiN barrier layer 38 is optionally deposited over main metal interconnect layer 36 to a thickness of from about 10 nm to about 100 nm, using any of the previous methods discussed for the formation of a TiN layer. It should be noted, in this regard, that the provision of top TiN barrier layer 38 is optional, particularly when the resulting metal interconnect stack is the top metal interconnect stack in the integrated circuit structure, i.e., when no further metal-filled vias will be formed in an insulation layer over the metal interconnect stack.

After formation of layers 30, 32, 34, 36, and optional layer 38 of FIG. 3, an etch mask (not shown) is formed over the interconnect layers, and the layers are then all conventionally etched through the etch mask, resulting in the metal interconnect stack shown at 50 in FIG. 4, comprising TiN first barrier layer metal interconnect portion 40, titanium metal seed layer metal interconnect portion 42, main TiN barrier layer metal interconnect portion 44, main metal interconnect 46, and top TiN barrier layer metal interconnect portion 48.

Metal stack 50 is deliberately shown etched to a mismatch with tungsten plug 20, in FIG. 4, to thereby expose portion 22 of the top surface of tungsten plug 20. By comparing FIG. 4 with prior art FIG. 1, it will be noted that the mismatch and exposure of portion 22 of the top surface of tungsten plug 20 in FIG. 4 of the invention does not result in a directly abutting junction of the tungsten and titanium metals exposed to etching or cleaning fluids which could result in galvanic attack. Rather, in accordance with the invention, first TiN barrier layer portion 40 separates tungsten plug 20 from titanium metal interconnect portion 42, thus inhibiting corrosion and attack of either tungsten 20 or titanium 42.

While we do not wish to be bound by any theories as to how the galvanic action is suppressed by the additional TiN barrier layer of the invention, and it is recognized that galvanic action could still occur if the etchant/cleaning solution was in contact with both tungsten plug 20 and titanium metal interconnect portion 42, apparently the provision of first TiN barrier portion 40 of the invention between tungsten plug 20 and titanium metal interconnect portion 42 (to thereby space apart tungsten plug 20 from titanium metal interconnect portion 42), and the surface tension of the etchant/cleaning solution, cooperate to inhibit the formation of any bridge between the tungsten and titanium metals to form a galvanic cell.

The following comparative example will serve to further illustrate the invention. Two silicon semiconductor wafers were provided, each having already formed thereon a silicon oxide ($SiO_2$) insulation layer, and at least one tungsten-filled via formed in the insulation layer. Over one of the wafers was formed a first TiN barrier layer, in accordance with the invention, of about 10 nm (100 Angstroms) thickness. Both of the wafers were then subjected to identical conventional metal interconnect processing consisting of the deposition of a titanium metal seed layer of about 20 nm (200 Angstroms); the formation of a main TiN barrier layer of about 25 nm (250 Angstroms) in thickness over the titanium metal seed layer and having a <111> orientation; an aluminum-copper alloy layer (also having the <111> orientation) formed over the main TiN barrier layer to a thickness of about 500 nm (5000 Angstroms); and a top TiN barrier layer having a thickness of about 25 nm (250 Angstroms). Identical etch masks were then formed over the just-described layers on both of the two wafers and the multiple layers on the two wafers were then etched through the etch mask to form metal interconnect stacks. For illustrative purposes only, the etch masks formed on the two wafers were deliberately mismatched to permit a portion of the top surface of the underlying tungsten plug in the via to be exposed in each case, i.e., the tungsten plug is not completely covered by the resulting metal interconnect stack. The etch residues remaining on the two wafers were then removed with a cleaning solution such as, for example, EKC 265 cleaning solution, an aqueous hydroxylamine-based organic cleaning solution available from EKC Technology, Inc. Both wafers were then left to stand for a period of about 20 minutes. The two wafers were then examined for galvanic corrosion using an electrical resistance test which tests the resistance of the tungsten plug. The wafer having the first TiN barrier layer of the invention formed beneath the titanium seed layer (i.e., between the top surface of the tungsten plug in the via and the titanium seed layer) was found to not have any high resistance contact due to galvanic corrosion, i.e., there was no visible sign of attack of either the tungsten metal plug or the titanium metal seed layer and the resistance averaged about 4–8 Ω per tungsten plug. The other wafer not having the first TiN barrier layer of the invention, was found to have high resistance contacts due to corrosion on the exposed surface of the tungsten plug and also traces of titanium oxide, indicating oxidation of a portion of the titanium metal seed layer had also occurred.

Thus, the invention provides for the formation of an additional barrier layer such as a TiN barrier layer, beneath the titanium seed layer in a metal interconnect stack of an integrated circuit structure, to physically separate the titanium metal seed layer in the metal interconnect stack from the underlying tungsten plug in the via or contact opening, whereby exposure of the respective titanium metal seed layer and the tungsten metal plug to solutions such as cleaning or etchant solutions will not result in the formation of galvanic corrosion.

Having thus described the invention what is claimed is:

1. A metal interconnect stack for an integrated circuit structure comprising:
   a) a main metal interconnect layer;
   b) an underlying main TiN barrier layer;
   c) a titanium metal seed layer below said main TiN barrier layer; and
   d) a lower barrier layer beneath said titanium metal seed layer, said lower barrier layer ranging in thickness from about 5 nm (50 Angstroms) up to about 50 nm (500 Angstroms), to provide protection against chemical interaction between said titanium metal seed layer and an underlying metal plug in a via formed in an insulation layer of said integrated circuit structure beneath said metal interconnect stack.

2. The metal interconnect stack of claim 1 wherein said main metal interconnect layer is provided with a <111> crystallographic orientation to enhance the electron migration of said main metal interconnect layer.

3. The metal interconnect stack of claim 2 wherein said main TiN barrier layer is also provided with <111> crystallographic orientations, so that said main TiN barrier layer will act as a seed layer for said main metal interconnect layer.

4. The metal interconnect stack of claim 1 wherein said metal interconnect stack is further provided with an upper TiN barrier layer formed over said main metal interconnect layer.

5. The metal interconnect stack of claim 1 wherein said lower barrier layer beneath said titanium metal seed layer comprises a lower TiN barrier layer.

6. The metal interconnect stack of claim 5 wherein a TiN/titanium metal gradient is formed between said lower TiN barrier layer and said titanium metal seed layer by forming said lower TiN barrier layer by sputtering titanium from a titanium target in the presence of one or more nitrogen-containing gases and/or vapors which react with the sputtered titanium atoms to form said TiN, and then slowly reducing the amount of said one or more nitrogen-containing gases and/or vapors to form said gradient.

7. A metal interconnect stack for an integrated circuit structure comprising:
   a) a main metal interconnect layer having a <111> crystallographic orientation;
   b) an underlying main TiN barrier layer also having said <111> crystallographic orientation;
   c) a titanium metal seed layer below said main TiN barrier layer; and
   d) a TiN layer ranging in thickness from about 5 nm (50 Angstroms) up to about 50 nm (500 Angstroms) formed beneath said titanium metal seed layer to provide protection against chemical interaction between said titanium metal seed layer and an underlying tungsten metal plug in a via formed in an insulation layer of said integrated circuit structure beneath said metal interconnect stack.

8. The metal interconnect stack of claim 7 wherein said metal interconnect stack is further provided with a third TiN barrier layer formed over said main metal interconnect layer.

9. The metal interconnect stack of claim 1 wherein said lower barrier layer beneath said titanium metal seed layer ranges in thickness from about 5 nm (50 Angstroms) up to about 30 nm (300 Angstroms).

10. The metal interconnect stack of claim 1 wherein said lower barrier layer beneath said titanium metal seed layer comprises a material selected from the group consisting of titanium nitride (TiN), tungsten nitride (WN), and tantalum nitride (TaN).

11. A metal interconnect stack for an integrated circuit structure comprising:
   a) a main metal interconnect layer;
   b) an underlying main TiN barrier layer;
   c) a titanium metal seed layer below said main TiN barrier layer; and
   d) a lower barrier layer beneath said titanium metal seed layer comprising a material selected from the group consisting of titanium nitride (TiN), tungsten nitride (WN), and tantalum nitride (TaN), said lower barrier layer having a minimum thickness of at least 5 nm (50 Angstroms) to provide protection against chemical interaction between said titanium metal seed layer and an underlying metal plug in a via formed in an insulation layer of said integrated circuit structure beneath said metal interconnect stack.

* * * * *